(12) United States Patent
Muecke et al.

(10) Patent No.: US 11,538,694 B2
(45) Date of Patent: Dec. 27, 2022

(54) MANUFACTURING A MODULE WITH SOLDER BODY HAVING ELEVATED EDGE

(71) Applicant: Infineon Technologies AG, Neubiberg (DE)

(72) Inventors: Achim Muecke, Erwitte (DE); Arthur Unrau, Geseke (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/951,633

(22) Filed: Nov. 18, 2020

(65) Prior Publication Data

US 2021/0166952 A1 Jun. 3, 2021

(30) Foreign Application Priority Data

Nov. 28, 2019 (DE) ...................... 10 2019 132 332.0

(51) Int. Cl.
*H01L 21/48* (2006.01)
*H01L 23/492* (2006.01)
*H01L 25/00* (2006.01)
*H01L 25/07* (2006.01)
*H01L 25/18* (2006.01)

(52) U.S. Cl.
CPC ...... *H01L 21/4871* (2013.01); *H01L 23/4922* (2013.01); *H01L 25/50* (2013.01); *H01L 25/072* (2013.01); *H01L 25/18* (2013.01)

(58) Field of Classification Search
CPC ............ H01L 21/4871; H01L 23/4922; H01L 25/50
See application file for complete search history.

(56) References Cited

U.S. PATENT DOCUMENTS

| 2013/0308276 | A1  | 11/2013 | Suzuki |
| 2015/0108642 | A1  | 4/2015  | Daubenspeck et al. |
| 2017/0200711 | A1* | 7/2017  | Uzoh .................. H01L 21/6836 |
| 2019/0088550 | A1* | 3/2019  | Ganitzer ................. H01L 24/05 |
| 2021/0391310 | A1* | 12/2021 | Trunov ................ H05K 3/3463 |
| 2022/0051964 | A1* | 2/2022  | Unrau ................. H01L 23/3735 |

FOREIGN PATENT DOCUMENTS

| DE | 3907681         | 9/1990  |
| DE | 10 2014 115 202 | 4/2016  |
| DE | 10 2015 108 481 | 12/2016 |
| DE | 102017004626    | 11/2018 |
| JP | H05315375       | 11/1993 |

* cited by examiner

*Primary Examiner* — Thao P Le
(74) *Attorney, Agent, or Firm* — Dicke, Billig & Czaja, PLLC

(57) ABSTRACT

A method of manufacturing a module is disclosed. In one example, the method comprises providing at least one solder body with a base portion and an elevated edge extending along at least part of a circumference of the base portion. At least one carrier, on which at least one electronic component is mounted, is placed in the at least one solder body so that the at least one carrier is positioned on the base portion and is spatially confined by the elevated edge.

10 Claims, 3 Drawing Sheets

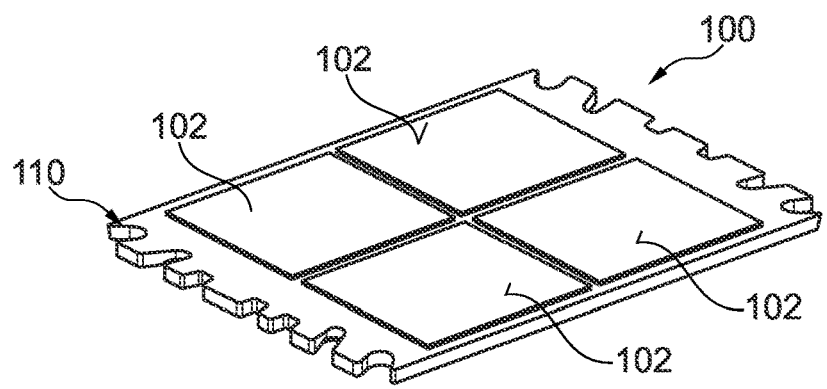
Fig. 7
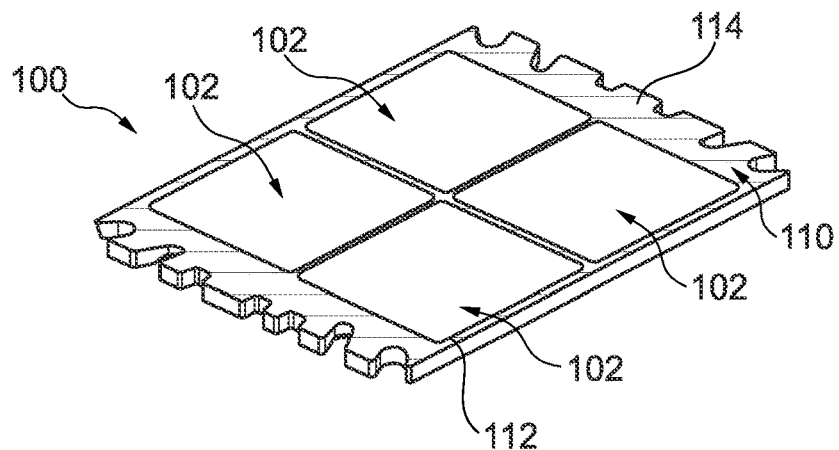
Fig. 8
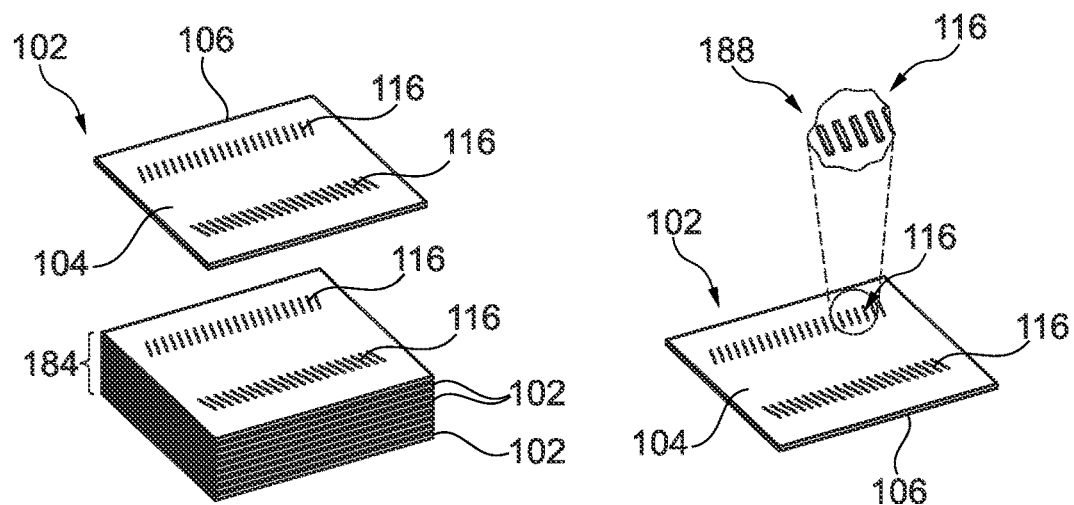
Fig. 9
Fig. 10

MANUFACTURING A MODULE WITH SOLDER BODY HAVING ELEVATED EDGE

CROSS-REFERENCE TO RELATED APPLICATION

This Utility Patent Application claims priority to German Patent Application No. 10 2019 132 332.0, filed Nov. 28, 2019, which is incorporated herein by reference.

BACKGROUND

Technical Field

Various embodiments relate generally to a method of manufacturing a module, a solder body for manufacturing a module, and a method of use.

DESCRIPTION OF THE RELATED ART

A power module provides the physical containment for one or more power components, such as power semiconductor devices. These power semiconductors may be soldered or sintered on a substrate which can be mounted, in turn, on a support body. A high effort may be involved for ensuring spatial accuracy of the constituents of such a module.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 7 illustrates a three-dimensional view of a support body and solder bodies of the module of FIG. 2.

FIG. 8 illustrates another three-dimensional view of a support body and solder bodies of a module manufactured according to an exemplary embodiment.

FIG. 9 illustrates a stack of solder bodies with adhesion-reducing surface profiles according to another exemplary embodiment.

FIG. 10 illustrates details of a stackable solder body with adhesion-reducing surface profile according to an exemplary embodiment.

DETAILED DESCRIPTION

Figure 1:
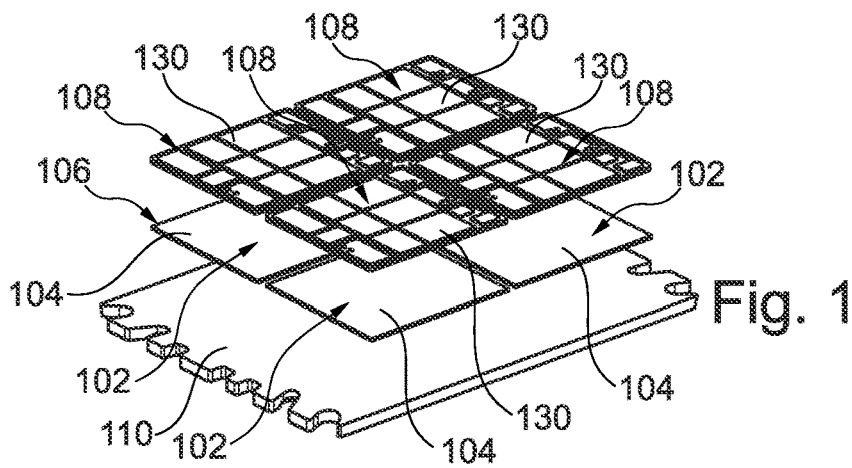
FIG. 1 illustrates constituents of a module according to an exemplary embodiment before assembly.

There may be a need to manufacture a module with high spatial accuracy and small effort.

According to an exemplary embodiment, a method of manufacturing a module is provided, wherein the method comprises providing at least one solder body with a base portion and an elevated edge extending along at least part of a circumference of the base portion, and placing at least one carrier, on which at least one electronic component is mounted, in the at least one solder body so that the at least one carrier is positioned on the base portion and is spatially confined or delimited by the elevated edge.

According to another exemplary embodiment, a solder body for manufacturing a module is provided, wherein the solder body comprises a base portion for accommodating a carrier, and an elevated edge extending along at least part of a circumference of the base portion so that the carrier is spatially confinable or delimitable by the elevated edge.

According to another exemplary embodiment, a solder body having the above-mentioned features is used for manufacturing a power module.

According to an exemplary embodiment, a solder body with an elevated edge is provided as a solder interface between a carrier with electronic component(s) on top and a support body on bottom. The elevated edge may define a cavity or accommodation volume for a bottom portion of the carrier and may thereby spatially delimit or confine the carrier at a target position or within a target range. Undesired sliding of a carrier on a solder body—involving the risk of loss of a proper spatial relationship between solder body and carrier—can thereby be reliably prevented. Such embodiments may also allow to carry out system soldering for module manufacture without the need of a solder auxiliary device which is conventionally used for ensuring correct positioning of solder bodies with respect to carriers. Descriptively speaking, the design of a solder body of an exemplary embodiment itself ensures proper alignment between solder body and carrier. Hence, the process of manufacturing modules may be significantly simplified and accelerated. Furthermore, resources may be used more efficiently, while simultaneously ensuring proper spatial relationship between the constituents of the module.

In the following, further exemplary embodiments of the manufacturing method, the solder body, and the method of use will be explained.

In the context of the present application, the term "module" may particularly denote an electronic device which may comprise one or more electronic components mounted on one or more carriers. The one or more carriers may be soldered on a support body by one or more solder bodies.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "carrier" may particularly denote a body (preferably, but not necessarily being electrically conductive) which serves for mechanically carrying the one or more electronic components, and which may optionally also contribute to the electric interconnection between the electronic component(s) and the periphery of the module. In other words, the carrier may fulfil a mechanical carrying function and optionally an electric connection function. Preferably, but not necessarily, the carrier may be partially or entirely electrically conductive.

In the context of the present application, the term "solder body" may particularly denote a physical body made of a material which can be used for establishing a solder connection between two constituents (in particular a carrier and a support body).

In the context of the present application, the term "base portion" may particularly denote a portion of the solder body on which a bottom surface of a carrier, to be solder-connected with a support body, may be placed. Preferably, the base portion may be substantially flat or planar.

In the context of the present application, the term "elevated edge" may particularly denote a circumferentially closed or open rim which defines one or more lateral abutment surfaces against which a carrier, placed on the above-described base portion, may abut in the presence of a horizontal force tending to displace the carrier with respect to the solder body. The elevated edge may be configured to mechanically disable excessive horizontal sliding of the carrier relative to the solder body, since such an undesired sliding will result in an abutment of a bottom portion of the carrier against the elevated edge. Thus, the elevated edge may serve for defining a target position or target range of the carrier in the solder body with elevated edge. For instance, the elevated edge may form a circumferentially closed ring. Alternatively, the circumferentially arranged elevated edge may comprise one or multiple separate edge structures arranged along a perimeter of the base portion to thereby define outer limits for a position of a carrier. For instance, it is possible that respective separate portions of the elevated edge are formed in two opposing corners or even all four corners of the solder structure (for instance as L-shaped profiles). It is also possible to form respective sections of the elevated edge for instance in central portions of all four sides of the in particular rectangular solder body (for instance as straight profiles).

In an embodiment, a cavity for accommodating a bottom portion of the carrier is delimited by the base portion and the elevated edge. Such a cavity may thus be formed in the solder body by the base portion and the elevated edge, wherein the method may comprise placing a respective carrier in the cavity prior to soldering so that the carrier is protected by the elevated edge against laterally sliding out of the cavity. Preferably, the elevated edge prevents sliding of the carrier out of the cavity within an entire horizontal plane. Consequently, the elevated edge may render it mechanically impossible that the carrier horizontally moves out of the cavity by a horizontal force.

In an embodiment, the method comprises providing a plurality of solder bodies each with a base portion and an elevated edge extending along at least part of a circumference of the respective base portion, and placing each of a plurality of carriers in an assigned one of the solder bodies so that each of the carriers is positioned on a respective base portion and is spatially confined by a respective elevated edge. At least one electronic component may be mounted on each of the carriers. Hence, it is possible to manufacture a complex module with multiple carriers and for instance the same number of solder bodies, one for each carrier.

In an embodiment, the method comprises connecting the solder body with the carrier by soldering. Soldering may be accomplished by providing sufficient heat to make the solderable material of the solder body flowable, for instance by heating it to a temperature in a range between 200° C. and 400° C., for instance about 350° C.

In an embodiment, the method comprises placing the at least one solder body on a support body, which may also form part of the manufactured module. For instance, the support body may be a bottom plate (for instance a metal plate) on which the solder bodies and, indirectly, the carriers are assembled.

In embodiment, the method comprises placing the at least one solder body on the support body before placing the at least one carrier in the at least one solder body. Assembly of the one or carriers on the solder bodies can be carried out in a simple way and with proper precision when the solder bodies are already aligned with the support body beneath.

In an embodiment, the method comprises connecting the solder body with the support body by soldering. This may be accomplished in particular simultaneously with connecting the at least one solder body with the at least one carrier by soldering. Hence, when the one or more solder bodies arranged between the support body and the one or more carriers become flowable at solder temperature, this may trigger formation of a solder connection between these vertically stacked constituents.

In an embodiment, the method comprises providing the support body with at least one solderable portion, into which material of the at least one solder body will flow during soldering, and at least one non-solderable portion, into which material of the solder body will not flow during soldering. By taking this measure, the spatial solder flow during soldering may be precisely controlled. Surface portions of the support body on which an assigned carrier shall be soldered by solder material of the assigned solder body can be homogeneously covered with solder material by preventing that solder material flows into one or more regions in which soldering is not desired. More generally, the non-solderable portion or portions may be defined by configuring their surface in such a way that they are not wettable by solder material.

In an embodiment, the at least one non-solderable portion is defined by a solder resist, an oxide surface or a laser treated surface. Other options of defining one more portions which are not wettable by flowable solder material are possible.

In a preferred embodiment, the method comprises, before forming a solder connection by the at least one solder body, provisionally attaching (in particular without soldering the solder body over its entire lower surface onto the support body) the at least one solder body to the support body. Said provisional attachment may be carried out in such a manner that a lateral sliding of the at least one solder body relative to the support body is disabled by the provisional attachment. Hence, by provisionally defining a spatial relationship between support body and the one or more solder bodies, a high overall spatial accuracy may be obtained. The provisional attachment may be of such a connection strength that undesired sliding of the one or more solder bodies with respect to the support body is prevented.

In an embodiment, provisionally attaching the solder body to the support body is carried out by one of the group consisting of a volatile adhesive agent provided between support body and the one or more solder bodies, spot soldering the one or solder bodies to the support body and laser welding the one or solder bodies on the support body. Care should be taken to avoid that the described provisional attachment of the solder body to the support body results in a loss of the shape of the elevated edge due to an excessive heat impact during provisionally attaching the solder body to the support body. For instance, an adhesive agent which is volatile, i.e. evaporates during subsequent soldering, may be used for this purpose. Alternatively, a connection between a partial surface of the support body and a partial surface of the respective solder body may be established by spot welding or the like.

In an embodiment, the method comprises forming the elevated edge by one of the group consisting of bending and embossing. For instance, it is possible to manufacture the solder body by bending or embossing a planar preform of the solder body along at least part of its perimeter. Such a planar preform may be punched out of a flat sheet of solderable material. Thus, the solder body with elevated edge may be formed with low effort, for instance based on a larger plate of solderable material which can be processed by punching, bending and/or embossing. The bending of the edge may be along the entire perimeter or only partially.

In an embodiment, the module is configured as power module. Correspondingly, one or more power semiconductor chips may be provided on and/or in each of the at least one carrier. Examples for such power semiconductor chips are MOSFET (metal oxide semiconductor field effect transistor) chips, IGBT (insulated gate bipolar transistor) chips, diode chips, etc.

In an embodiment, the solder body is cup-shaped. Such a cut-shaped or bowl-shaped solder body may precisely define a target area in which a carrier may be accommodated.

In an embodiment, the solder body consists of solderable material. Thus, the entire solder body may only be made of solderable material.

In an embodiment, the base portion is a plate portion. Thus, the plate-shaped base portion may define a planar accommodation surface for a corresponding substantially planar bottom surface of a carrier.

In an embodiment, the edge is angled with respect to the base portion. "Angled" may mean in this context that, in a side view or cross-sectional view of the solder body, the base portion and the elevated edge each have a substantially straight shape with a kink or sharp bend in between. An angled edge provides a well-defined abutment surface for a slightly misaligned carrier.

In an embodiment, the edge is angled with respect to the base portion by an angle of 90°. An angle of 90° provides highly efficient abutment surfaces.

In another embodiment, the edge is angled with respect to the base portion by an angle in a range of above 90° to not more than 150°. An angular range between 90° and 150° has the advantage that the corresponding solder bodies are stackable in a space-saving way.

In another embodiment, the edge is curved with respect to the base portion. "Curved" may mean in this context that, in a side view or cross-sectional view of the solder body, the base portion and the elevated edge are connected to each other in a continuous, smooth kink-free fashion. With such a curvature, a smooth transition between base portion and elevated edge may be accomplished which drives back a slightly misaligned carrier into a target position in a controlled way.

In an embodiment, at least part of a surface of the base portion is provided with a surface profile. Such a surface profile may be formed in an upper main surface and/or a lower main surface of the base portion for inhibiting adhesion between adjacent solder bodies of a stack of solder bodies. Advantageously, such a surface profile may reduce the adhesion forces between adjacent solder bodies when being stacked. This simplifies handling of the solder bodies during an assembly process.

In an embodiment, the elevated edge protrudes vertically beyond the base portion by a distance in a range between 50 μm and 1 mm, in particular in a range between 150 μm to 500 μm. Hence, already relatively small deviations from a fully planar shape of the solder body may be sufficient to properly define the target position of a carrier placed on a respective solder body and avoid misalignment.

In an embodiment, the module or package comprises a plurality of electronic components mounted on the carrier. Thus, the package may comprise one or more electronic components.

In an embodiment, a connection between the electronic component and the carrier is formed by a connection medium. For instance, the connection medium may be a solder structure, a sinter structure, a welding structure, and/or a glue structure. Thus, mounting the one or more electronic components on the carrier may be accomplished by soldering, sintering or welding, or by adhering or gluing.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor, or an IGBT, insulated gate bipolar transistor), at least one diode, etc. In particular, circuits fulfilling a half-bridge function, a full-bridge function, etc., may be manufactured.

In an embodiment, the modules are configured as power converter, in particular one of an AC/DC power converter and a DC/DC power converter. However, also other electronic applications, such as inverters, etc. may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to an exemplary embodiment, system soldering during manufacturing a power module may be accomplished by provisionally and partially connecting an upper mounting surface of a support body with a lower surface of a cup-shaped solder body. The solder body, due to its cup shape, may advantageously define a target accommodation volume of a carrier to be placed therein. Preferably after provisionally connecting the support body with the one or more solder bodies at a bottom side, a respective carrier with surface mounted electronic component(s) may be placed in the cavity of the provisionally connected and cup-shaped respective solder body. Thereafter, the obtained arrangement of support body, one or more solder bodies thereon and one or more carriers with surface-mounted power semiconductor chips in the solder bodies may be interconnected with each other by soldering. Advantageously, the twofold definition of the spatial relationship between support body, solder bodies and carriers by (i) the provisional partial attachment between support body and solder bodies and (ii) the spatial confinement of a respective carrier accommodation volume within the respective solder body may render the manufacturing process very simple. In particular, the use of an auxiliary solder device or tool may be dispensable according to exemplary embodiments for ensuring spatial accuracy.

In order to be able to position carriers with surface mounted chips precisely during a soldering process for connection with a plate-shaped support body, the carriers are conventionally soldered with preform soldering in special solder devices. However, such solder devices or molds have the disadvantage that they are mechanically complex. This results in high manufacturing effort and long production times for the equipment.

According to an exemplary embodiment, it may be possible to realize, by the use of a pre-formed solder body with edge elevation, system soldering of a module without the requirement of a soldering device. System soldering is a procedure carried out during the production of power modules for interconnecting chip carriers with a support body. The constituents for system soldering are thus a support body (for instance a module base plate), a pre-formed or pre-shaped solder body and one or more carriers. On each carrier, one or a plurality of electronic components such as power semiconductor chips are mounted.

According to an exemplary embodiment, a shell-shaped or cup-shaped solder body is provided. After a punctual, not full-surface pre-fixing or provisional attachment of the support body on the respective solder body and after a subsequent assembly of a carrier in each solder body, system soldering may be carried out. As a result, the respective solder body may be precisely positioned in a horizontal direction with respect to the support body or module base plate. Furthermore, each carrier may be precisely aligned with respect to its assigned solder body in view of a properly defined accommodation cavity confined by the elevated edge. This ensures a proper positioning of pre-formed solder bodies and carriers with respect to a support body before system soldering. In particular, the mentioned provisions may ensure a reliable protection against vibrations and shocks.

Figure 2:
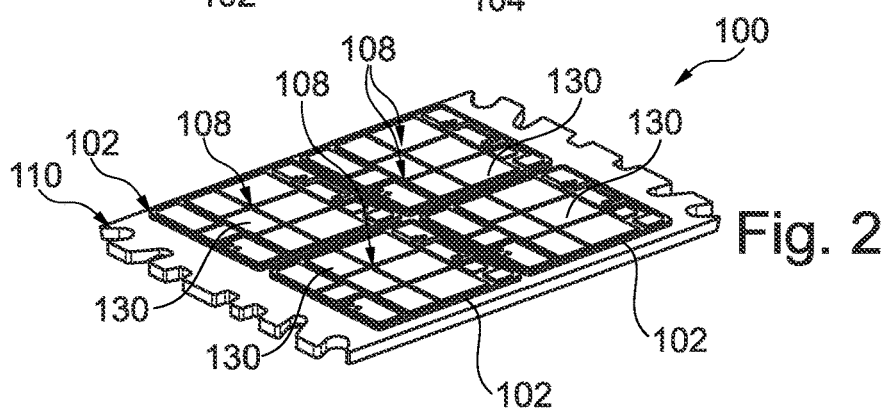
FIG. 2 illustrates the constituents of the module of FIG. 1 after assembly.
Figure 3:
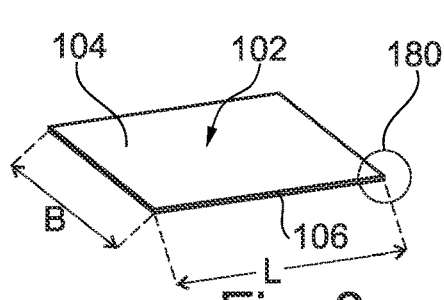
FIG. 3 illustrates a solder body of the module of FIG. 2.
Figure 4:
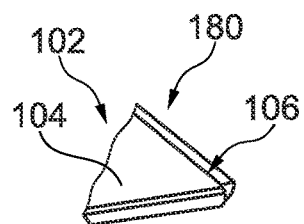
FIG. 4 illustrates a detail of the solder body of FIG. 3.
Figure 5:
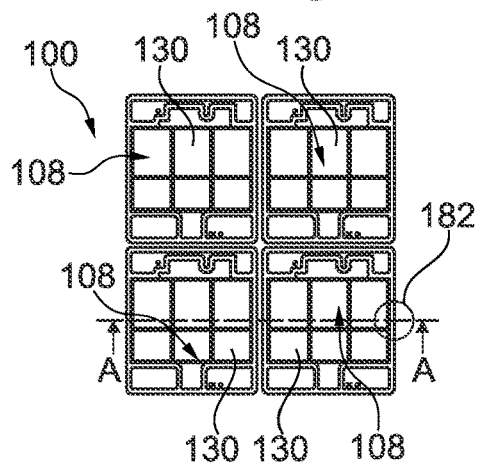
FIG. 5 illustrates a plan view of the module of FIG. 2.
Figure 6:
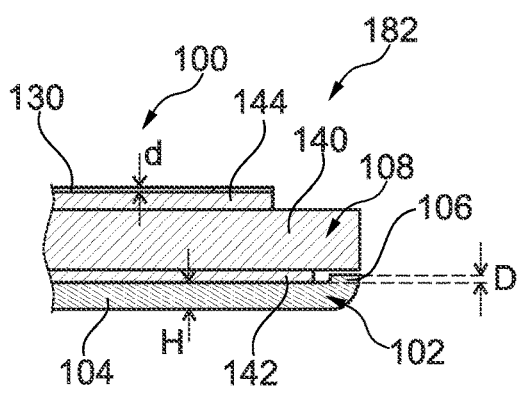
FIG. 6 illustrates a cross-sectional view of part of the module of FIG. 2 along a line A-A of FIG. 5.

FIG. 1 illustrates constituents of a module 100 before assembly according to an exemplary embodiment. FIG. 2 illustrates the constituents of the module 100 of FIG. 1 after assembly. The stacked arrangement shown in FIG. 1 and FIG. 2 shall provide a thermally conductive connection between the shown constituents. FIG. 3 illustrates a solder body 102 of the module 100 of FIG. 2. FIG. 4 illustrates a detail 180 of the solder body 102 of FIG. 3. FIG. 5 illustrates a plan view of the module 100 of FIG. 2. FIG. 6 illustrates a cross-sectional view of a detail 182 of the module 100 along a line A-A shown in FIG. 5. FIG. 7 illustrates a three-dimensional view of a support body 110 and solder bodies 102 of the module 100 of FIG. 2 before accommodating carriers 108 with electronic components 130 mounted thereon in cavities defined by the shape of the solder bodies 102.

The readily manufactured module 100 shown in FIG. 2 comprises a support body 110 as a (for instance metallic) bottom base plate of the module 100. For instance, the support body 110 may be a leadframe, a printed circuit board, an AMB substrate or a DAB (direct aluminium bonding) or DCB (direct copper bonding) substrate. It is also possible that the support body 110 is a metal plate or a metal ceramic compound.

A plurality of solder bodies 102 are used for manufacturing the module 100. For instance, each solder body 102 may be made of a solderable material such as SnAg, SnPb, SnSb, NiSn, NiSnSb, AgSnCu and/or SnPbAg. Before soldering, each comprises a planar plate-shaped base portion 104 and an elevated edge 106. This can be seen best in FIG. 4 and FIG. 6. In the shown embodiment, the elevated edge 106 extends along the entire circumference of the base portion 104. In other words, the elevated edge 106 of the described embodiment has a closed annular shape.

A plurality of carriers 108 is provided, wherein each carrier 108 is accommodated in an assigned one of the multiple solder bodies 102. For instance, a carrier 180 may be a leadframe, a ceramic substrate having metallic layers on both opposing main surfaces thereof, etc. More specifically, the carrier 102 may be for instance a DCB substrate, a DAB substrate, a leadframe, an AMB substrate or a ceramic or glass carrier. One or more electronic components 130 may be on the respective carrier 130. For instance, such electronic components 130 may for instance be power semiconductor chips such as IGBTs, diodes, MOSFETs or resistors.

The electronic components 130 may be soldered or sintered on the respective carrier 108. They may also be wire-bonded to establish a desired electric connection. It is also possible that a top surface of the electronic components 130 and a top surface of the respective carrier 108 are provided with an appropriate coating, such as a coating with a silicone gel.

Each carrier 108 may be accommodated in a cavity formed by the elevated edge 106 so that the elevated edge 106 extends vertically along part of the sidewall of the respective carrier 108 (see FIG. 6). When a carrier 108 unintentionally slides on the solder body 102 prior to soldering, the sidewall of the bottom portion of the carrier 108 will abut against the elevated edge 106 which will therefore prevent that the respective carrier 108 is erroneously positioned with respect to the assigned base portion 104. In other words, since each carrier 108 is spatially confined by the respective elevated edge 106 of the assigned solder body 102, a correct mutual positioning between carrier 108 and solder body 102 can be ensured.

In the described embodiment, multiple electronic components 130 are mounted on each of the carriers 108. Said electronic components 130 may be power semiconductor dies, such as MOSFET dies, IGBT dies, diode dies, resistor components, etc. Consequently, module 100 may be configured as power module 100.

One powerful measure to obtain the described high spatial accuracy is the described configuration of the solder body 102 used for manufacturing the module 100. As shown in particular in FIG. 4 and FIG. 6, the solder body 102 comprises the flat or planar base portion 104 for accommodating a bottom surface of an assigned carrier 108. Moreover, each solder body 102 comprises the elevated edge 106 extending along the entire circumference of the base portion 104 as an annular rim. Consequently, the accommodated carrier 108 is spatially delimited and confined by the elevated edge 106. Descriptively speaking, the solder body 102 is cup-shaped or bowl-shaped. Preferably, the solder body 102 consists exclusively of solderable material. The solder body 102 composed of base portion 104 and elevated edge 106 may be preferably integrally formed. As shown in FIG. 3, the base portion 104 is a plate portion. In the described embodiment and as can be seen in FIG. 6, the edge 106 is curved with respect to the base portion 104. In the shown embodiment, the curved edge 106 has a substantially circular rounding at an interface to the base portion 104.

For manufacturing the illustrated module 100, a number of (for instance four) solder bodies 102 is provided. Each solder body 102 is shaped to have the described plate-shaped base portion 104 and the vertically protruding elevated edge 106 extending as a ring (or part thereof) along the perimeter of the base portion 104. The elevated edge 106 vertically protrudes beyond the base portion 104 and may be formed by bending or embossing a planar blank of solderable material. Referring to FIG. 3 and FIG. 4, the solder body 102 may be stamped and may then be made subject to a bending or embossing procedure for defining the elevated edge 106.

Referring to FIG. 6, the elevated edge 106 may be formed to protrude vertically beyond the base portion 104 by a distance D. Distance D is preferably in a range between 150 μm to 500 μm. A cavity for accommodating a bottom portion of the carrier 108, as shown in FIG. 6, is thus delimited by the base portion 104 and the elevated edge 106.

As indicated in FIG. 6, a vertical thickness H of the base portion 104 may be in a range between 150 and 350 μm. Referring to FIG. 3, a length L and a width B of the substantially rectangular solder body 102 may each be in a range between 20 mm and 70 mm, so that the area of the solder body 102 may be in a range from 20×20 mm$^2$ to 70×70 mm$^2$. As shown in FIG. 6, the electronic component 130 may for instance have a thickness d in a range between 40 μm and 100 μm when it is a power semiconductor chip. The electronic component 130 can also be a surface-mounted device such as a resistor and may then have a larger thickness d of for instance up to 1 mm or even up to 2 mm.

Still referring to FIG. 6, the carrier 108 is a DCB (direct copper bonding) substrate and may have a central electrically insulating and thermally conductive sheet 140 (for instance made of a ceramic) covered on both opposing main surfaces thereof with a respective metallic sheet 142, 144 (for instance copper sheets). The central sheet 140 may for instance have a thickness in a range between 0.35 mm and 1 mm. The metallic sheets 142, 144 may each have a thickness in a range between 250 μm and 500 μm.

Next, manufacture of module 100 will be explained. Firstly, the solder bodies 102 are placed on planar support body 110, as shown in FIG. 7. Still before subsequently forming a solder connection between the support body 110 and carriers 108 having surface mounted electronic components 130, the facing surfaces of the solder bodies 102 on the one hand and of the support body 110 on the other hand are provisionally and only partially attached to each other. This provisional attaching or prefixing of the solder bodies 102 and the support body 110 may be carried out for example by using a volatile adhesive agent increasing adhesion between the contact surfaces of support body 110 and respective solder body 102. Additionally or alternatively, the provisional partial attachment may be accomplished by spot soldering and/or laser welding. A further powerful measure to obtain the described high spatial accuracy is the mentioned provisional attachment of support body 110 and solder bodies 102. Undesired relative sliding between support body 110 and solder bodies 102 prior to soldering the solder bodies 102 may therefore be reliably prevented. When using an adhesive agent for pre-pinning the support body 110 and the solder bodies 102, such an adhesive agent may modify the surface tension for fixing. Spot welding and laser welding may pre-pin support body 110 and solder body 102 together by a thermal impact.

Thereafter, each of a number of carriers 108 (in the shown embodiment four) may be placed in the cavities of the solder bodies 102. On each carrier 108, a number of electronic components 130 (for instance power semiconductor chips) is surface mounted. Each carrier 108 may be placed in the cavity of an assigned solder body 102 being already prefixed at the support body 110. Hence, each carrier 108 is placed on the base portion 104 of the assigned solder body 102 and is spatially confined by the elevated edge 106.

Thereby, a desired spatial relationship between support body 110, solder bodies 102 and carriers 108 may be ensured with high precision. Thus, the solder bodies 102 are placed and pre-fixed on the support body 110 before placing the carriers 108 in the assigned solder bodes 102. For instance, a positional accuracy may be in a range of ±0.3 to ±1 mm prior to soldering.

Thereafter, the provisionally pre-connected arrangement of support body 110, solder bodies 102 and carriers 108 may be made subject to a soldering process. For instance, said arrangement may be placed in a solder oven (not shown) and may be heated to an elevated temperature of for example 350° C. As a result, the solderable material of the solder bodies 102 becomes flowable, re-solidifies and is thereby integrally connected with the support body 110 and with the carriers 108 by soldering. During said soldering process, the solder material of the solder bodies 102 becomes flowable, subsequently re-solidifies and thereby accomplishes the described permanent solder connections. During soldering, it is for instance possible to use a flux, as known by those skilled in the art.

FIG. 1 illustrates constituents for the described system soldering to be carried out during manufacturing the module 100. The system soldering means that the parts or constituents illustrated in FIG. 1 are firmly connected to each other to obtain module 100 shown in FIG. 2. Hence, FIG. 2 shows the result of the system soldering. By exemplary embodiments, said system soldering may be carried out advantageously without separate solder device, tool or mold. For this purpose, the pre-formed solder bodies 102 (see FIG. 3 and FIG. 4) are provided in a bowl-shape or cup-shape. At planar base plate 104, an edge elevation is created as elevated edge 106 by bending or embossing. This allows to guide the respective carrier 108 into a solder shell in form of an assigned solder body 102 (see FIG. 5 and FIG. 6). Hence, FIG. 5 and FIG. 6 illustrate a horizontal carrier guide through shell-shaped solder bodies 102. Referring to FIG. 6, the solder shell or solder body 102 has a bending angle of 90°.

In order to ensure a precise positioning of the solder body 102 and the carrier 108 on the support body 110 (which may be embodied as module base plate) before processing in the soldering oven, the solder body 102 (compare FIG. 7) can be treated with a volatile adhesion agent for obtaining a partial pinning before soldering the carrier 108 with the support body 110 by means of the solder body 102. This ensures that vibrations and shocks before soldering do not cause any displacement of solder body 102 and applied carrier 108, also with respect to support body 110. Provisional attachment or pinning is for instance also possible by a partial heat impact to accomplish dot soldering, laser welding, etc. FIG.

7 illustrates the structure obtained after pinning the solder bodies 102 to the support body 110. FIG. 7 shows the result of the partial thermal attachment between support body 110 and solder bodies 102. Thus, FIG. 7 illustrates a scenario before placing the carrier 108 in the cavities formed on the upper side of the solder bodies 102 thanks to the elevated edge 106.

FIG. 8 illustrates a three-dimensional view of a support body 110 with pre-fixed solder bodies 102 of a module 100 according to another exemplary embodiment. Advantageously, the support body 110 of FIG. 8 may be equipped with solderable portions 112 into which material of the solder bodies 102 will flow during soldering. The solderable portions 112 may correspond to the surface portions of the support body 110 on which the solder bodies 102 are to be placed. Moreover, the surface of the support body 110 may be provided with one or more non-solderable portions 114, which may also be denoted as non-wettable portions, into which flowable solder material of the solder bodies 102 will not flow during soldering. For instance, the mentioned non-solderable portion 114 may be embodied as a solder resist or an oxide surface.

In order to avoid leakage of the liquid solder during the soldering process, it is possible to provide the non-wetting surfaces of the support body 110 with solder-repellent surfaces, as shown in FIG. 8. Thus, during the soldering process, a centering of the carriers 108 can be carried out by surface stresses of the liquid solder. The solder-repellent surface can be defined by a solder-stop varnish or an oxide surface. Hence, FIG. 8 shows solder-repellent surfaces on the module base plate or support body 110. Descriptively speaking, the solder material of the solder bodies 102 only flows into the wettable or solderable surface portions 112, not in the non-wettable or non-solderable surface portions 114. This improves the homogeneity of the solder material provided on surface portions of the support body 110 on which the carriers 108 shall be mounted.

FIG. 9 illustrates a stack 184 of solder bodies 102 with adhesion-reducing surface profiles 116 according to another exemplary embodiment. FIG. 10 illustrates a detail 188 of a stackable solder body 102 with adhesion-reducing surface profile 116 according to an exemplary embodiment.

The solder body 102 shown in FIG. 9 and FIG. 10 can be designed in a bowl-shaped way. The solder bowl or solder body 102 of the shown embodiment may have an elevated edge 106 with an angle of more than 90° with respect to the planar solder surface defined by the base portion 104. As a result of such an obtuse angle, the solder bodies 102 are advantageously stackable.

Moreover, the base portion 104 of the solder bodies 102 shown in FIG. 9 and FIG. 10 are partially provided with a surface profile 116. Although not shown, both opposing main surfaces of the base portion 104 may be provided with such a surface profile 116. In order to allow a better stackability of the pre-formed solder bodies 102, the angle between base portion 104 and elevated edge 106 can be above 90° and preferably not more than 150°. A corresponding bending can be made in a curved manner with a radius (see FIG. 6) or angled or sharp-edged.

In order to ensure a better separation between stacked solder bodies 102, lower adhesive forces between the stacked individual solder bodies 102 can be realized by embossing of the planar surface. FIG. 9 and FIG. 10 show such an embossed solder body 102.

Figure 11:
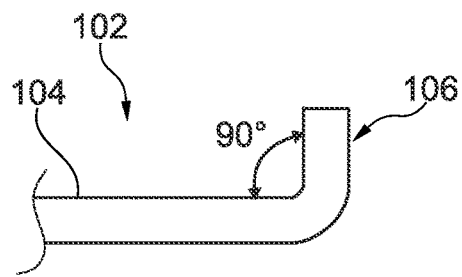
FIG. 11 illustrates a detail of an elevated edge of a solder body according to an exemplary embodiment with a bending angle of 90°.

FIG. 11 illustrates a detail of an elevated edge 106 of a solder body 102 according to an exemplary embodiment. According to FIG. 11, the edge 106 is angled with respect to the base portion 104 by an angle of 90°.

Figure 12:
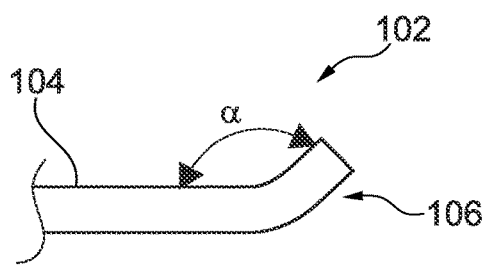
FIG. 12 illustrates a detail of an elevated edge of a solder body according to another exemplary embodiment with a bending angle larger than 90°.

FIG. 12 illustrates a detail of an elevated edge 106 of a solder body 102 according to another exemplary embodiment. According to FIG. 12, the edge 106 may be angled with respect to the base portion 104 by an angle in a range between 90° and 150°.

Figure 13:
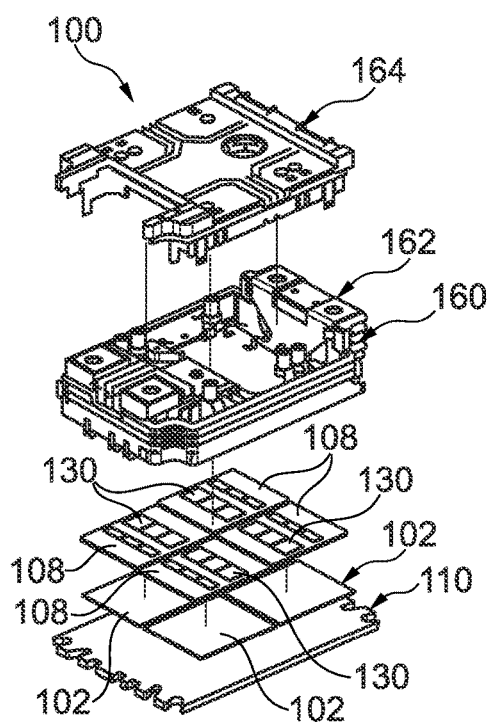
FIG. 13 illustrates an exploded view of a module according to an exemplary embodiment.
Figure 14:
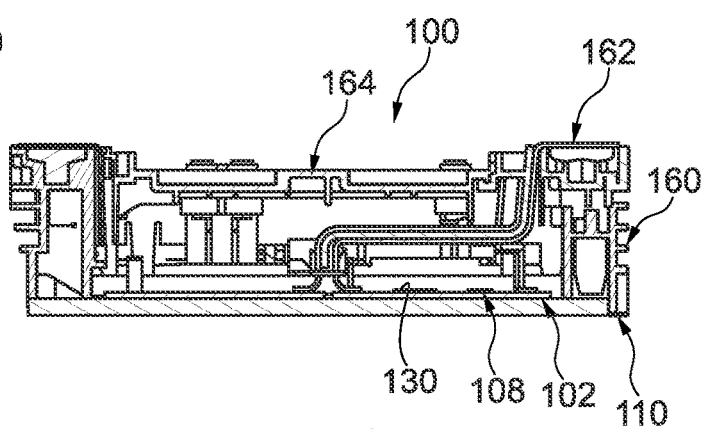
FIG. 14 illustrates a cross-sectional view of the module of FIG. 13.

FIG. 13 illustrates an exploded view of a module 100 according to an exemplary embodiment. FIG. 14 illustrates a cross-sectional view of this module 100.

FIG. 13 and FIG. 14 show that further constituents may be provided for completing manufacture of the module 100. FIG. 13 shows in a lower portion the above described support body 110, solder bodies 102 and carriers 108. Above the carriers 108, a frame 160 with electric terminals 162 is shown. A lid 164 is attached to the upper side of the frame 160. The frame 160, in turn, is placed on top of the carriers 108 with surface-mounted electronic components 130.

FIG. 14 shows the module 100 in the completely assembled configuration.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a module, wherein the method comprises:
    providing at least one solder body with a base portion and an elevated edge extending along at least part of a circumference of the base portion;
    placing at least one carrier, on which at least one electronic component is mounted, in the at least one solder body so that the at least one carrier is positioned on the base portion and is spatially confined by the elevated edge;
    providing a plurality of solder bodies each with a base portion and an elevated edge extending along at least part of a circumference of the respective base portion; and
    placing each of a plurality of carriers, wherein at least one electronic component is mounted on each of the carriers, in an assigned one of the solder bodies so that each of the carriers is positioned on a respective base portion and is spatially confined by a respective elevated edge.

2. The method according to claim 1, wherein the method comprises connecting the at least one solder body with the at least one carrier by soldering.

3. The method according to claim 1, wherein the method comprises placing the at least one solder body on a support body.

4. The method according to claim 3, wherein the method comprises placing, and in particular pre-fixing, the at least one solder body on the support body before placing the at least one carrier in the at least one solder body.

5. The method according to claim 3, wherein the method comprises connecting the at least one solder body with the support body by soldering, in particular simultaneously with connecting the at least one solder body with the at least one carrier by soldering.

6. A method of manufacturing a module, wherein the method comprises:
- providing at least one solder body with a base portion and an elevated edge extending along at least part of a circumference of the base portion;
- placing at least one carrier, on which at least one electronic component is mounted, in the at least one solder body so that the at least one carrier is positioned on the base portion and is spatially confined by the elevated edge;
- wherein the method comprises placing the at least one solder body on a support body; and
- the support body with at least one solderable portion, into which material of the at least one solder body will flow during soldering, and at least one non-solderable portion, into which material of the at least one solder body will not flow during soldering.

7. The method according to claim 6, wherein the at least one non-solderable portion comprises at least one of the group consisting of a solder resist, an oxide surface, and a laser treated surface.

8. A method of manufacturing a module, wherein the method comprises:
- providing at least one solder body with a base portion and an elevated edge extending along at least part of a circumference of the base portion;
- placing at least one carrier, on which at least one electronic component is mounted, in the at least one solder body so that the at least one carrier is positioned on the base portion and is spatially confined by the elevated edge;
- wherein the method comprises placing the at least one solder body on a support body; and
- forming a solder connection by the at least one solder body, provisionally attaching the at least one solder body to the support body, in particular in such a manner that a lateral sliding of the at least one solder body relative to the support body is disabled by the provisional attachment.

9. The method according to claim 8, wherein provisionally attaching the at least one solder body to the support body is carried out by one of the group consisting of providing an adhesive agent, spot soldering and laser welding.

10. The method according to claim 1, wherein the method comprises forming the elevated edge by one of the group consisting of bending and embossing, in particular bending or embossing a planar preform of the solder body.

* * * * *